(12) United States Patent
Dasgupta

(10) Patent No.: US 6,529,077 B1
(45) Date of Patent: Mar. 4, 2003

(54) GAIN COMPENSATION CIRCUIT FOR CMOS AMPLIFIERS

(75) Inventor: Uday Dasgupta, Singapore (SG)

(73) Assignees: Institute of Microelectronics, Singapore (SG); Oki Techno Centre (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 09/933,964

(22) Filed: Aug. 22, 2001

(51) Int. Cl.[7] ............................................... H03F 3/45
(52) U.S. Cl. ...................................... 330/254; 330/261
(58) Field of Search ............................. 330/133, 134, 330/254, 257, 261, 285, 278

(56) References Cited

U.S. PATENT DOCUMENTS

| | | | |
|---|---|---|---|
| 4,409,558 A | 10/1983 | Knijnenburg et al. | 330/288 |
| 4,916,407 A | 4/1990 | Olver | 330/151 |
| 4,929,909 A | 5/1990 | Gilbert | 330/256 |
| 5,274,339 A | 12/1993 | Wideman et al. | 330/54 |
| 5,406,221 A * | 4/1995 | Samani et al. | 330/254 |
| 5,673,047 A | 9/1997 | Moreland | 341/139 |
| 5,994,961 A | 11/1999 | Lunn et al. | 330/254 |
| 5,999,051 A * | 12/1999 | Terada et al. | 330/254 |
| 6,018,270 A | 1/2000 | Stuebing et al. | 330/278 |
| 6,046,642 A | 4/2000 | Brayton et al. | 330/296 |
| 6,300,832 B1 * | 10/2001 | Okazaki | 327/359 |
| 6,331,802 B1 * | 12/2001 | Kim | 330/133 |

OTHER PUBLICATIONS

*Analog Integrated Circuit Design*, Johns and Martin, John Wiley & Sons, Inc., New York, 1999, pp. 248–251.

* cited by examiner

*Primary Examiner*—My-Trang Nu Ton
(74) *Attorney, Agent, or Firm*—George O. Saile; Stephen B. Ackerman; Billy Knowles

(57) ABSTRACT

A gain compensation circuit that compensates for variations in gain of a high gain, high frequency amplifier due to changes in mobility of transistor and resistor components of the amplifier. The gain compensation circuit includes a current adjustment circuit and a gain factor evaluation circuit. The current adjustment circuit modifies a bias current provided to each amplifier stage of a plurality of amplifier stages that make up the high gain, high frequency amplifier. The modification of the bias current adjusts the gain factor of the amplifier. The gain factor evaluation circuit is in communication with the current adjustment circuit to determine changes in the gain factor of the high gain, high frequency amplifier. From the determination, the gain factor evaluation circuit provides a compensation signal to the current adjustment circuit indicating a modification factor for the biasing current for each amplifier stage.

22 Claims, 11 Drawing Sheets

GAIN COMPENSATION CIRCUIT FOR CMOS AMPLIFIERS

BACKGROUND OF THE INVENTION

1. Field of the Invention

This invention relates to high gain, high frequency amplifier circuits.

More particularly, this invention relates to circuits that compensate for changes and fluctuations in the gain of high gain, high frequency amplifier circuits due environmental factors such as manufacturing process, temperature, and operating conditions.

2. Description of Related Art

The basic structure of a differential amplifier well known in the art and is generally as shown in FIG. 1. The n-type metal oxide semiconductor (NMOS) transistors M1 and M2 are generally coupled at their sources and connected to the current source $I_B$. The drains of the NMOS transistors M1 and M2 are respectively connected to the equal valued load resistors RL1 and RL2. The gates of the NMOS transistors M1 and M2 are respectively connected to the input terminals IN1 and IN2. The drain currents of the NMOS transistors M1 and M2 are summed and must be equal to the current of the current source $I_B$. It can thus be shown that the voltage present at the drain of the NMOS transistors M1 and M2 is equal to:

$$V_{OUTd} = -g_m RL_n V_{INd}$$

where:

$V_{OUTd}$ is the differential voltage at the output nodes OUT1 and OUT2.

$g_m$ is the transconductance of the NMOS transistors M1 and M2.

$RL_n$ is the resistance of the resistors RL1 or RL2.

$V_{INd}$ is the differential voltage at the input nodes IN1 and IN2.

The variations in the differential voltage $V_{OUTd}$ due to variations in the environmental factors such as temperature, process parameters, and operating conditions can be shown to effect the values of the transconductance gm of the NMOS transistors M1 and M2 and the dependence of the resistors RL1 and RL2 to the environmental factors. One method for compensation of these variations is to place the source degeneration resistors $Rs_1$ and $Rs_2$ respectively in the source connections of the NMOS transistors M1 and M2. The source degeneration resistors $Rs_1$ and $Rs_2$ have resistance designs to sufficiently improve the immunity of the differential amplifier to the variations, but not impact the dynamic range of the output voltage $V_{OUTd}$.

The effective transconductance $g_{ms}$ of the NMOS transistors M1 and M2 in combination with the source degeneration resistors $Rs_1$ and $Rs_2$ can be shown to be equal to:

$$g_{ms} = \frac{g_m}{1 + g_m Rs} \quad \text{Eq. 1}$$

Further, the gain of the differential amplifier is then expressed as:

$$Av = \frac{V_{OUTd}}{V_{INd}} = g_{ms} RL_n \quad \text{Eq. 2}$$

As is known the appropriate choices of the materials for the resistors $Rs_1$ and $Rs_2$ and the resistors RL1 and RL2 minimize the effects of the environmental factors. However, this does not stabilize the gain completely.

As the gain requirements for an amplifier increases, multiple differential amplifiers of FIG. 1 are cascaded as shown in FIG. 2. The first differential stage $Av_1$ of the cascaded amplifier is formed of the NMOS transistors M20 and M21, the load resistors RL3 and RL4, the current source $I_{B1}$, and the source degeneration resistors $Rs_1$ and $Rs_2$ configured as shown in FIG. 1. The second differential stage $Av_2$ of the cascaded amplifier is formed of the NMOS transistors M22 and M23, the load resistors RL5 and RL6, the current source $I_{B2}$, and the source degeneration resistors $RS_3$ and $Rs_4$, also configured as shown in FIG. 1. Similarly, the third differential stage $AV_3$ of the cascaded amplifier is formed of the NMOS transistors M24 and M25, the load resistors RL7 and RL8, the current source $I_{B3}$, and the source degeneration resistors $Rs_5$ and $Rs_6$, which are configured as shown in FIG. 1. The input nodes IN1 and IN2 are coupled by capacitors $C_{P1}$ and $C_{P2}$ to the gates of the NMOS transistors M20 and M21. The bias resistors $R_{B1}$ and $R_{B2}$ provide a biasing voltage from the biasing voltage power supply $V_{GG}$ to bias the amplifier $Av_1$ to operate in a linear, high gain region. The output terminals of the amplifier $Av_1$ are coupled through the capacitors $C_{P3}$ and $C_{P4}$ to the gates of the NMOS transistors M22 and M23. As described for the bias resistors $R_{B1}$ and $R_{B2}$, the bias resistors $R_{B3}$ and $R_{B4}$ provide a biasing voltage from the biasing voltage power supply $V_{GG}$ to bias the amplifier $Av_2$ to operate in a linear, high gain region. Next, the output terminals of the amplifier $Av_2$ are coupled through the capacitors $C_{P5}$ and $C_{P6}$ to the gates of the NMOS transistors M24 and M26. As described for the bias resistors $R_{B1}$ and $R_{B2}$ and the bias resistors $R_{B3}$ and $R_{B4}$, the bias resistors $R_{B5}$ and $R_{B6}$ provide a biasing voltage from the biasing voltage power supply $V_{GG}$ to bias the amplifier $Av_3$ to operate in a linear, high gain region. The output signal of the amplifier is coupled through the capacitors $C_{P7}$ and $C_{P8}$ to the output terminals OUT1 and OUT2. The gain of the amplifier of FIG. 2 is the product of the individual gains of the differential amplifier stages $Av_1$, $Av_2$, and $Av_3$ and are determined as defined above for the amplifier described in FIG. 1. Further, the number of differential amplifier stages $Av_1$, $Av_2$, and $Av_3$ is determined by the total gain required for the amplifier, thus the design of the individual stages may vary to accommodate the design requirements.

As described above the source degeneration resistors $Rs_3 Rs_4$, $Rs_5$ and $Rs_6$, $Rs_7$ and $Rs_8$ are added to partially compensate for the variations in the environmental factors. Further, other compensation techniques employ feedback to adjust the gain of the differential amplifier stages with changes in the environmental factors. However, feedback techniques do not work well when very large gain factors are required for the amplifier. In Analog Integrated Circuit Design, Johns and Martin, John Wiley & Sons, Inc., New York, 1999, pp. 248–251, the author notes that the transconductance of the NMOS transistors of a differential amplifier is the most important parameter to stabilize. The authors detail and analyze basic techniques to prevent variations of the transconductance with variations in the environmental factors.

U.S. Pat. No. 6,018,270 (Stuebing, et al.) describes a single biasing circuit for a single or multiple stage low voltage RF circuits including one or more amplifiers and one or more single or double balanced mixers. The biasing circuit incorporates compensation for temperature and integrated circuit process parameters.

U.S. Pat. No. 4,409,558 (Knijnenburg, et al.) describes a gain compensated transistor amplifier arrangement for use in power protection circuits. The amplifier includes an emitter-follower transistor. The collector current of the emitter-follower transistor is fed to a resistor to compensate for variations in the current gain factor of the transistors of the amplifier.

U.S. Pat. No. 4,916,407 (Olver) illustrates a gain variation compensating circuit for a feed-forward linear amplifier. The gain compensating circuit counteracts the gain variations and restores balance and fundamental cancellation to the circuit while retaining the highly linear characteristics of the amplifier.

U.S. Pat. No. 5,274,339 (Wideman, et al.) teaches circuit for compensating for GaAs FET amplifier gain variations over a frequency band as a function of temperature. The circuit includes a passive equalizer circuit having a fixed gain over the frequency band and an active equalizer circuit, in series with the passive equalizer, having a gain, which varies over the frequency band as a function of temperature.

U.S. Pat. No. 6,046,642 (Brayton, et al.) describes an active bias compensation circuit that senses a quiescent current flowing in an amplifier and adjusts the quiescent current to maintain an optimal DC biasing of the amplifier over a wide range of temperature variation, process variation, history of the amplifier, etc.

U.S. Pat. No. 5,673,047 (Moreland) describes a gain compensating difterential reference circuit that is used to match the gain of an input differential amplifier that is an input of an analog-to-digital converter to provide a biasing voltage to the analog-to-digital converter.

U.S. Pat. No. 4,929,909 (Gilbert) teaches a single differential amplifier including a current source for generating a biasing tail current to compensate for the non-ideal transistor geometries and properties. The compensation results in an amplification ratio, which is substantially independent of all component variations.

U.S. Pat. No. 5,994,961 (Lunn, et al.) teaches an amplifier circuit that has a gain control input signal to adjust the gain of the amplifier. The gain control input signal is passed through a temperature compensating circuit, which provides a gain compensation to adjust the gain of the amplifier for temperature. The gain of the amplifier is adjusted as desired, however, the amplifier gain is compensated for temperature variations.

SUMMARY OF THE INVENTION

An object of this invention is to provide a gain compensation circuit that compensates for variations in gain of a high gain, high frequency amplifier.

Another object of this invention is to provide a circuit that adjusts biasing currents of a high gain, high frequency amplifier to compensate fully for changes in mobility of transistor and resistor components of the amplifier.

To accomplish at least one of these objects and other objects, a gain compensation circuit includes a current adjustment circuit and a gain factor evaluation circuit. The current adjustment circuit modifies a bias current provided to each amplifier stage of a plurality of amplifier stages that make up a high gain, high frequency amplifier. The modification of the bias current adjusts the gain factor of the amplifier. The gain factor evaluation circuit is in communication with the current adjustment circuit to determine changes in the gain factor of the high gain, high frequency amplifier. From the determination, the gain factor evaluation circuit provides a compensation signal to the current adjustment circuit indicating a modification factor for the biasing current for each amplifier stage.

In a first embodiment of this invention, the current adjustment circuit has a first reference constant current source mirrored from a reference current source to generate a reference current. A first replica amplifier is connected to the first reference constant current source to conduct a master biasing current that is modified according to the compensation signal. Biasing currents for each amplifier is provided by a plurality of mirroring current sources. Each mirroring current source is in communication with the first replica amplifier stage such that each mirroring current sources generates one bias current proportional to the master bias current of the replica amplifier stage.

In a second and third embodiment of this invention, the current adjustment circuit is a plurality of mirroring current sources. The mirroring current sources provide the bias currents for each amplifier stage. The mirroring current sources receive the compensating signal from the gain factor evaluation circuit. In this embodiment, the compensating signal is a compensation current from which the bias currents are mirrored.

The gain factor evaluation circuit has a reference voltage source to provide a first and a second reference voltage, which are inputs to a second replica amplifier stage. The second replica amplifier stage amplifies a voltage difference between the first and the second reference voltages. The gain factor evaluation circuit has a compensation signal generator connected to the second replica amplifier stage to receive the amplified voltage difference, modulate a biasing current of the second replica amplifier stage and, when the amplified voltage difference approaches a null level, produce the compensation signal. The compensation signal generator is formed of an operational amplifier having an in-phase input and an out-of-phase input connected to receive the amplified voltage difference. The compensation signal generator has a first master current source that provides the biasing current to the second replica amplifier and a second master current source joined to the out-of-phase input of the operational amplifier. The second master current source causes a voltage level to be present at the out-of-phase input to be modified. The second master current source is coupled to the first master current source such that they are proportional, irrespective of environmental changes. The compensation signal generator further has a current feedback circuit connected between an output of the operational amplifier and the first master current source to sink a compensation current to the first master current source. The biasing current of the second replica amplifier and the compensating current are combined such that, as the operational amplifier changes the compensation current, the biasing current of the second replica amplifier adjusts inversely. The compensation signal generator additionally has a compensation signal converter communicating with the operational amplifier to form the compensation signal as a function of the compensating current. In the preferred implementation the compensation signal converter is a first voltage-to-current converter.

The current feedback is formed by a second voltage-to-current converter that transforms a compensating voltage at the output of the operational amplifier to the compensation current.

DETAILED DESCRIPTION OF THE INVENTION

Figure 1:
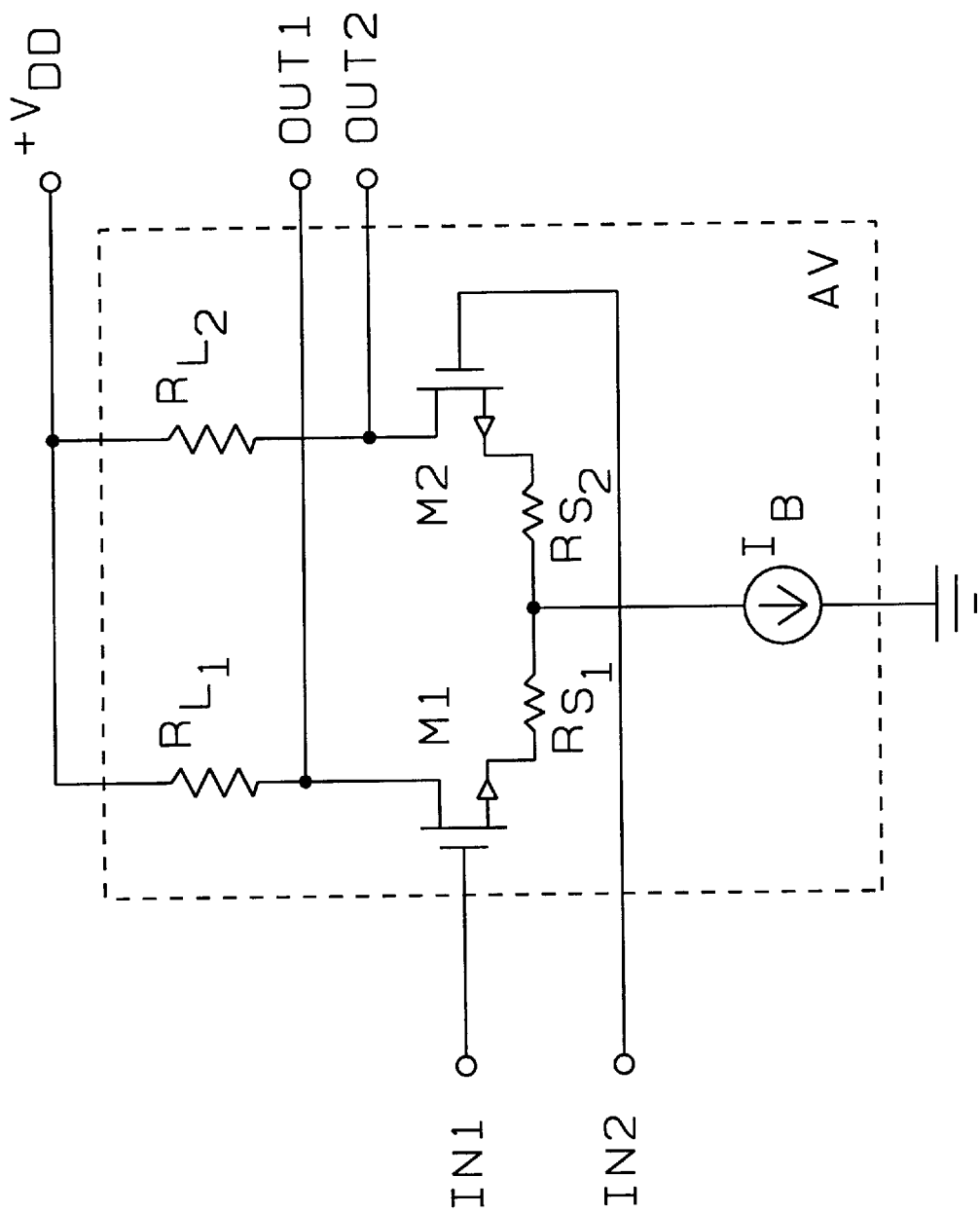
FIG. 1 is a schematic diagram of a differential amplifier stage having degenerative feedback of the prior art.

To adjust the total gain of the differential amplifier as shown in FIG. 1, the current through the NMOS transistors M1 and M2 must be adjusted to compensate for the changes in the transistors parameters due to the variations in the environmental factors such as process, temperature, and applied voltage. In the first embodiment of this invention, the current of the biasing current source $I_B$ is adjusted as the environmental factors change. In the second and third embodiments of this invention, the current of the current source $I_B$ is held as a constant value. A compensation current is added or subtracted with the biasing current source $I_B$ of the NMOS transistors M1 and M2. As the environmental factors change, the parameters such as mobility of the NMOS transistors M1 and M2 and the resistivity of the resistors $RL_1$, $RL_2$, $Rs_1$, and $Rs_2$ change. The compensation current is inversely varied to counteract these effects of the change in the parameters of the NMOS transistors M1 and M2 such that the gain of the high gain, high frequency amplifier remains essentially constant.

Figure 3:
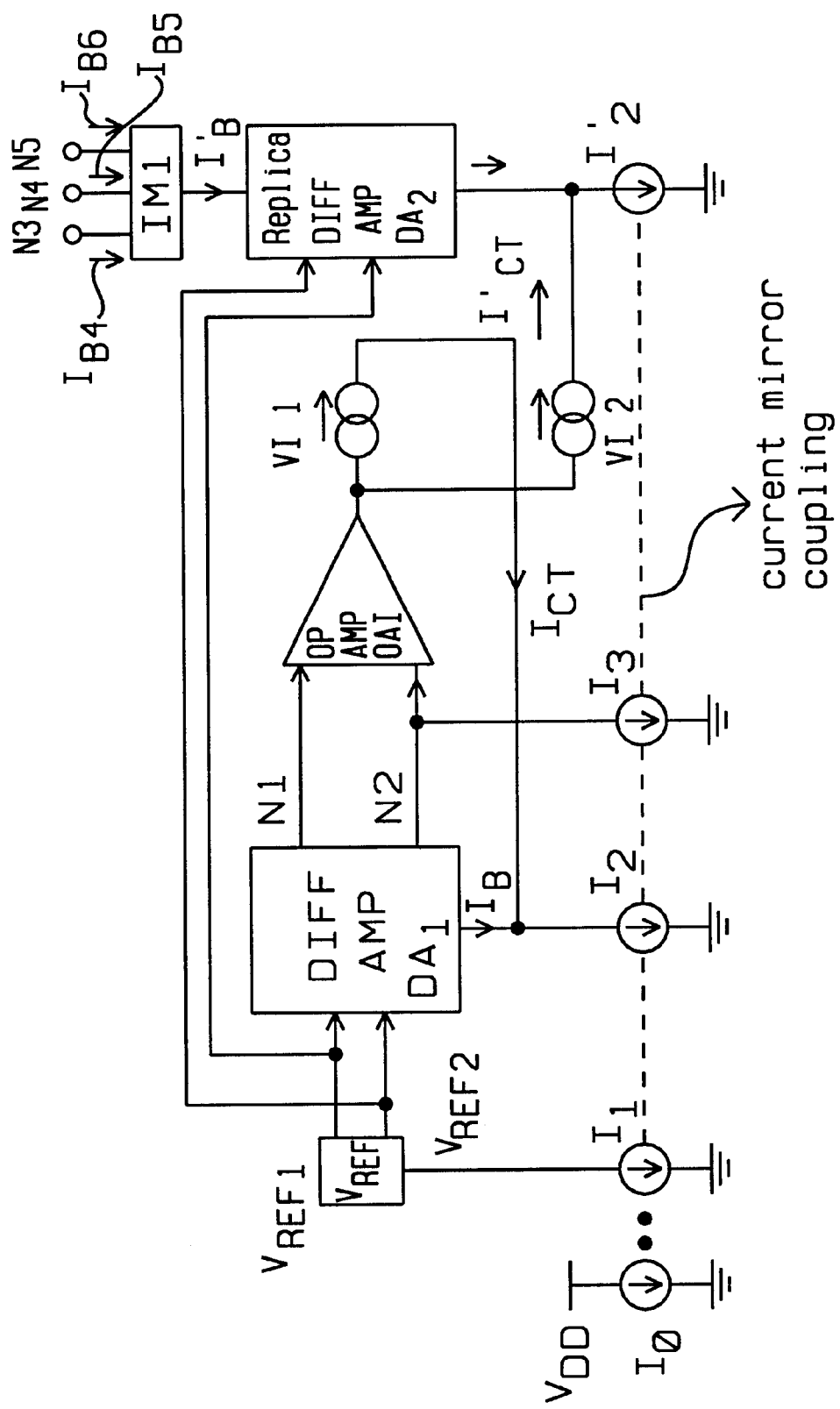
FIG. 3 is block diagram drawing of a first embodiment of a gain compensation circuit for a high gain, high frequency amplifier of this invention.

Refer now to FIG. 3 for a description of a bias current generator of the first and principal embodiment of this invention. The master current source $I_0$ is the reference current source that provides the controlling current for the current sources $I_1$, $I_2$, $I_3$, and $I'_2$ that are mirrored from the reference current source $I_0$. The current source I1 is coupled to supply the controlling current to the voltage reference generator $V_{REF}$. The voltage reference generator $V_{REF}$ produces the reference voltages $V_{REF1}$ and $V_{REF}$.

The reference voltages $V_{REF1}$ and $V_{REF2}$ are the inputs to the differential amplifier DA1. The differential amplifier DA1 is structured as shown in FIG. 1 having similar device geometries and resistance values. The biasing current 18 of the differential amplifier DA1 is supplied by the current source $I_2$. The output nodes $N_1$ and $N_2$ are the inputs to the operational amplifier OA1. The current source $I_3$ is connected to the output node $N_2$ to provide a biasing current the adjusts the voltage level of the output node $N_2$. The output of the operational amplifier is connected to a voltage-to-current converter VI1. The voltage output of the operational amplifier OA1 is converted and scaled to a current value within the voltage-to-current converter VI1. The compensation current $I_{CT}$ from the voltage-to-current converter VI1 is subtracted from the constant current $I_2$ to form the biasing current $I_B$ for the differential amplifier DA1. The compensation current $I_{CT}$ provides the feedback to adjust the biasing current $I_B$ of the differential amplifier DA1. This, in turn, adjusts the voltage at the output nodes $N_1$ and $N_2$ by changing the amplification factor of the differential amplifier DA1.

Any changes in the environmental factors cause the voltage at the output nodes $N_1$ and $N_2$ to be different. The compensation current $I_{CT}$ causes the biasing current $I_B$ to readjust such that the voltages at the output nodes $N_1$ and $N_2$ are brought to the same level. This, as shown hereinafter, ensures that the gain of the operational amplifier DA1 remains constant.

Figure 2:
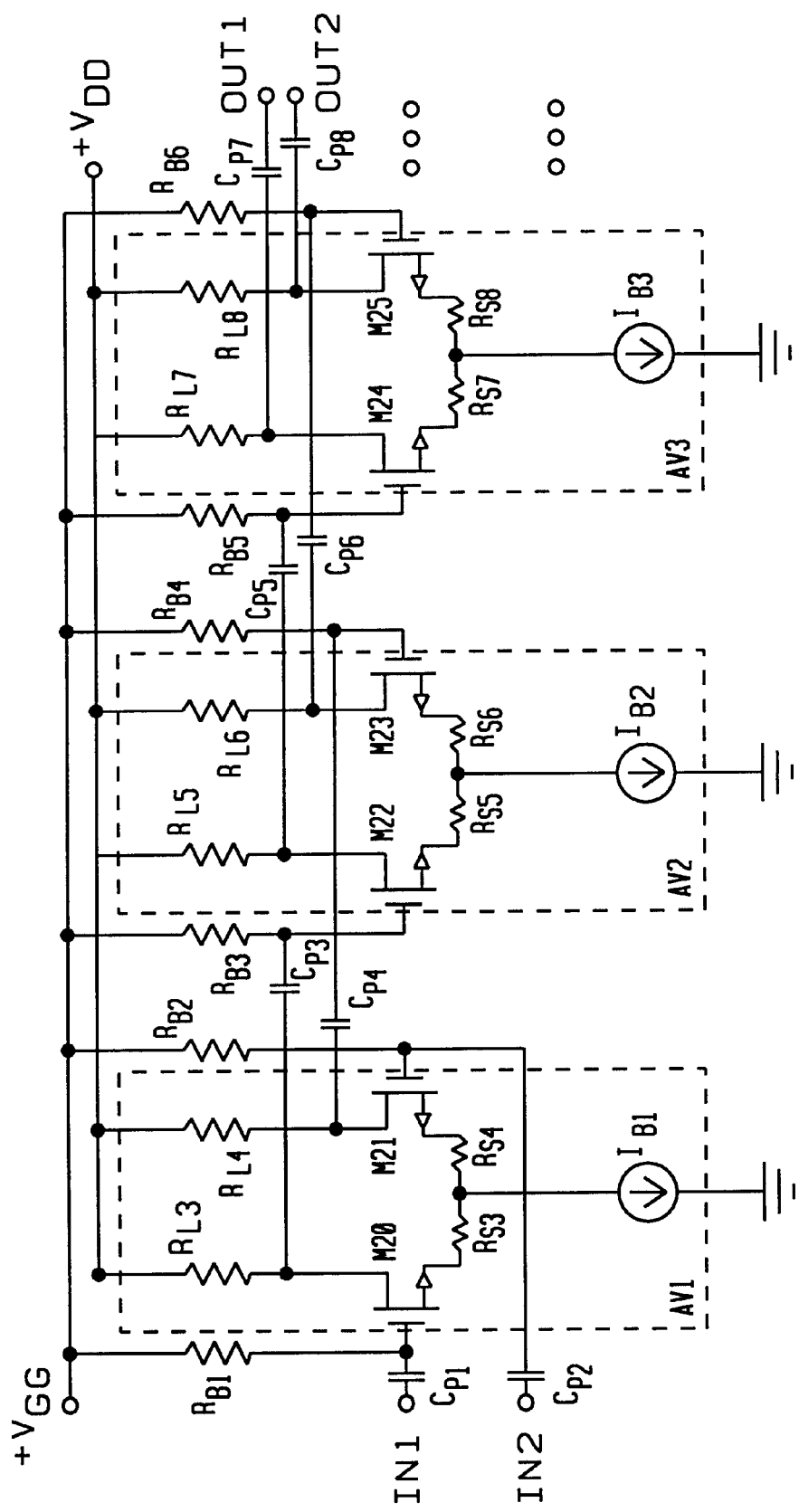
FIG. 2 is a schematic diagram of a high gain, high frequency amplifier of the prior art.
Figure 5:
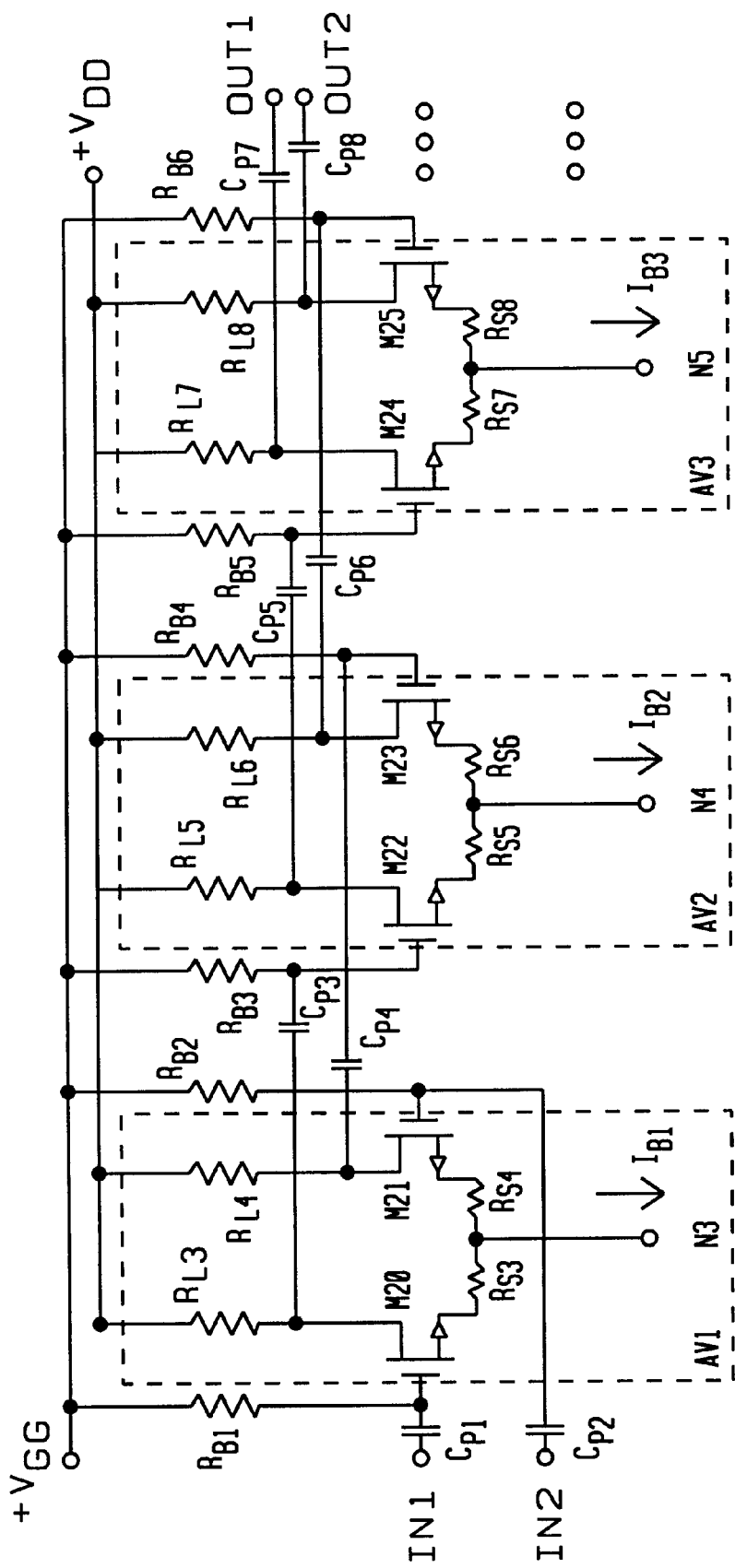
FIG. 5 is a schematic diagram of a high gain, high frequency amplifier that employs the first embodiment of a gain compensation circuit of this invention.

In the first embodiment, as explained above, the biasing currents of the differential amplifier stages are modulated to stabilize the gain of the differential amplifier stages as the environmental factors change. In FIG. 5, the high gain, high frequency amplifier is structured and functions as shown in FIG. 2 with the exception the current sources $I_{B1}$, $I_{B2}$, and $I_{B3}$ are now incorporated to the gain compensation circuit of this invention. The junction of the resistors $RS_3$ and $RS_4$, the junction of the resistors $RS_5$ and $RS_6$, and the junction of the resistors $RS_7$ and $RS_8$ are connected respectively to the nodes $N_3$, $N_4$, and $N_5$ that are connected to the gain compensation circuit of this invention. The gain compensation circuit provides the modulated biasing currents $I_{B4}$, $I_{B5}$, and $I_{B6}$.

Returning to FIG. 3, the nodes $N_3$, $N_4$, and $N_5$ are connected to the current mirror IM1, which sinks the modulated biasing currents modulated biasing currents $I_{B4}$, $I_{B5}$, and $I_{B6}$. To generate the modulated biasing currents $I_{B4}$, $I_{B5}$, and $I_{B6}$, the output of the operational amplifier OA1 is the input to the voltage-to-current converter VI2. The voltage-to-current converter VI2 is connected to the current source $I'_2$ and the output of the replica differential amplifier stage DA2. The replica differential amplifier stage DA2 is structured to be equivalent to the differential amplifier DA1 and has it input connected to the voltage reference generator $V_{REF}$ to receive the reference voltages $V_{REF1}$ and $V_{REF2}$. The current source $I'_2$ is designed to provide a current substantially equal to the current source $I_2$. The second compensation output current $I'_{CT}$ of the voltage-to-current converter VI2 is substanially equal to the compensation current $I_{CT}$, thus the bias current $I'_B$ is forced to be equal to the bias current $I_B$, which has been adjusted to compensate for variations due to the environmental factors. The biasing current $I'_B$ is the controlling current for the current mirror IM1. The modulated biasing currents $I_{B4}$, $I_{B5}$, and $I_{B6}$ are thus dependent upon the biasing current $I'_B$.

Figure 4:
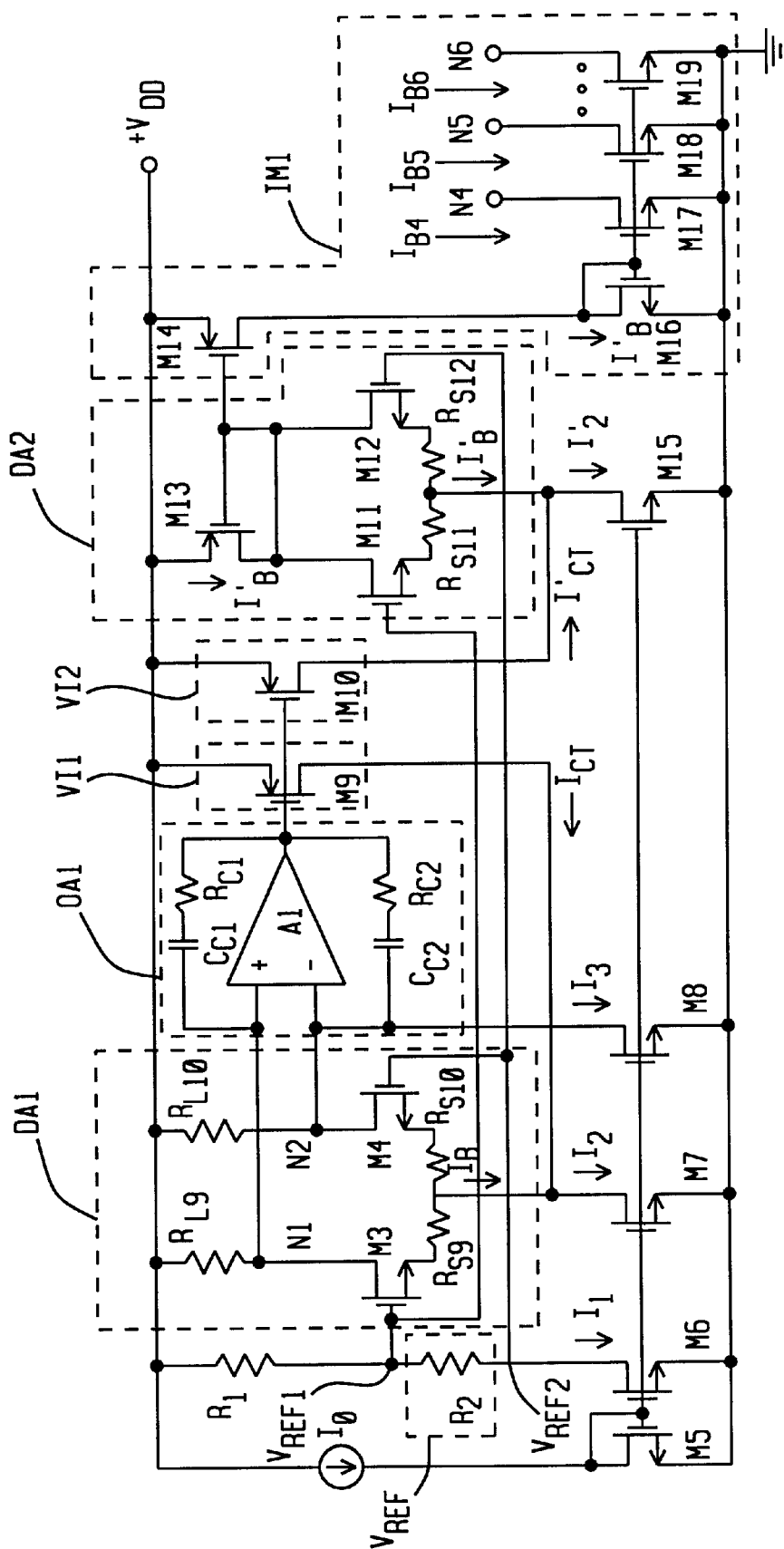
FIG. 4 is a schematic diagram of a first embodiment of a gain compensation circuit for a high gain, high frequency amplifier of this invention.

Refer now to FIG. 4 for a more detailed description of the gain compensation circuit of this invention. The NMOS transistors M5, M6, M7, M8, and M15 are structured to form a current mirror with the control current being the current source $I_0$, and the currents $I_1$, $I_2$, $I_3$, and $I'_2$ being mirrored from the control current $I_0$. The resistors $R_1$ and $R_2$ are connected serially to form a voltage divider. The voltage drop ($I_1R_2$) across the resistor $R_1$ determines the reference voltages $V_{REF1}$ and $V_{REF2}$.

The differential amplifier DA1 is formed by the transistors M3 and M4, the source degeneration resistors $RS_9$ and $RS_{10}$, and the load resistors $RL_9$ and $RL_{10}$ arranged as shown in FIG. 1. The NMOS transistor M7 with the NMOS transistor M5 form the current source $I_2$ for the differential amplifier DA1. The output node $N_1$ is the junction of the drain of the NMOS transistor M3 and the load resistor $RL_9$. Similarly, the output node $N_2$ is formed at the junction of the drain of the NMOS transistor M4 and the load resistor $RL_{10}$. The operational amplifier OA1 is formed of the single stage differential amplifier A1, the capacitors $C_{C1}$ and $C_{C2}$, and the resistors $R_{C1}$ and $R_{C2}$. The capacitors $C_{C1}$ and $C_{C2}$, and the resistors $R_{C1}$ and $R_{C2}$ form a compensation network for the differential amplifier A1. The noninverting input of the amplifier A1 is connected to the output node N1 of the differential amplifier DA1 and the inverting input of the amplifier A1 is connected to the output node N2 of the differential amplifier DA1.

The current source $I_3$ is formed by the NMOS transistor M8 with the NMOS transistor M5 and is connected to the inverting input (node N2) of the amplifier A1. The voltage at the Node N2 thus changed by the amount equal to $RL_{10}I_3$.

The PMOS transistors M9 and M10 respectively form the voltage-to-current converters VI1 and VI2. The PMOS transistors M9 and M10 have identical aspect ratios to insure that the compensation currents are $I_{CT}$ and $I'_{CT}$ are essentially equal. The current $I_{CT}$ is fed back to form the bias current $I_B$ after the subtraction from the current $I_2$.

The replica differential amplifier DA2 is formed by the NMOS transistors M11 and M12, and source degeneration resistors $RS_{11}$ and $RS_{12}$ arranged as shown in FIG. 1. The load resistors are replaced by the active load configured PMOS transistor M13. The NMOS transistor M15 with the NMOS transistor M5 form the current source $I'_2$ for the replica differential amplifier DA2.

As is known in the art the active load formed by the PMOS transistor M13 is essentially a current source. The PMOS transistor M14 is connected to mirror the current $I'_B$. The PMOS transistor M14 and the NMOS M16 form the controlling current source for the current mirror IM1 that generates the bias currents $I_{B4}$, $I_{B5}$, and $I_{B6}$. The current through the PMOS transistor M14 and the NMOS M16 designed to be essentially equal to the current $I'_B$. The NMOS transistors M17, M18, and M19 are structured respectively to the current sources to sink the bias currents $I_{B4}$, $I_{B5}$, and $I_{B6}$.

A negative feedback loop is formed with differential amplifier DA1, resistors $R_1$ and $R_2$, operational amplifier A1, the voltage-to-current converter VI1. The negative feedback loop forces the nodes N1 and N2 to the same DC potential.

The discussion presented hereinafter describes the function of the negative feedback loop and its operation to compensate for the variation in the environmental factors of temperature, process and power supply variations. The reference voltages $V_{REF1}$ and $V_{REF2}$ as created by the voltage drop $I_1R_2$ across the resistor $R_2$ causes a voltage difference between the nodes N1 and N2. The node N2 is at a higher potential, because of amplification by differential amplifier DA1 is equal to $g_{ms}R_L$ as shown in Eq. 1. Since the drop across resistor $R_2$ is fixed, the amount by which the potential at the node N2 is higher compared that at the node N1 depends on the magnitude of effective transconductance $g_{ms}$ only. However, the operational amplifier A1 is only sensitive to the difference of potentials at nodes N1 and N2. Therefore, the discussion can be simplifier by assuming the voltage level at the node N1 is fixed at zero potential. The potential at the node N2 increases with the transconductance $g_{ms}$ in the positive direction. On the other hand, the current $I_3$ acts to decrease the voltage potential at the node N2.

The examination of the feedback loop begins by assuming that the node N2 is at a positive voltage potential. This voltage potential will be amplified by the amplifier A1 which will, in turn, will cause the gate of the PMOS transistor M9 to go low causing the latter's drain current (the compensation current) $I_{CT}$ to increase. It can be observed from the circuit that the bias current $I_B$ of differential amplifier DA1 is actually the difference of current $I_2$ through the current source formed by the NMOS transistor M7 and the compensation current $I_{CT}$. Since the current $I_2$ is fixed, the bias current $I_B$ reduces as the compensation current $I_{CT}$ increases, reducing the effective transconductance $g_{ms}$ in turn. This reduction in the effective transconductance $g_{ms}$ causes the potential at the node N2 to decrease until it becomes zero. Conversely, assume that the node N2 is at a negative voltage potential. This time the amplifier A1 will cause the gate of the PMOS transistor $M_7$ to go high causing its drain current (compensation current) $I_{CT}$ to reduce. Consequently, bias current $I_B$ increases, increasing effective transconductance $g_{ms}$ and this increases the voltage potential at node N2 until it becomes zero again. Thus, if the feedback loop is designed correctly, the potentials at the nodes N1 and N2 remain virtually equal under steady state conditions.

The absolute voltages $V_{N1}$ and $V_{N2}$ at nodes N1 and N2 are respectively determined by the following equations as:

$$V_{N1} = V_{DD} - \left(\frac{g_{ms}R_L I_1 R_2}{2} + \frac{I_B R_L}{2}\right) \text{ and} \qquad \text{Eq. 3}$$

$$V_{N2} = V_{DD} - \left(-\frac{g_{ms}R_L I_1 R_2}{2} + \frac{I_B R_L}{2}\right) - I_3 R_L \qquad \text{Eq. 4}$$

The feedback loop, under steady state conditions ensure that the absolute voltages $V_{N1}$ and $V_{N2}$ at nodes N1 and N2 are essentially equal. Thus combining equations Eq. 3 and Eq. 4 the effective transconductance $g_{ms}$ is determined by the equation.

$$g_{ms} = \frac{I_3}{I_1} \frac{1}{R_2} \qquad \text{Eq. 5}$$

The equation Eq. 5 demonstrates the effect of the feedback loop in determining the transconductance $g_{ms}$ in terms of resistance $R_2$.

Without disturbing the feedback loop, several replicas of the bias current $I_B$ are generated using replica biasing and mirroring with voltage-to-current converter VI2 and the current mirror IM1. The voltage gains of the differential amplifier stages $AV_1$, $AV_2$, and $AV_3$ are determined by the combination of the equations Eq. 2 and Eq. 5 to become:

$$A_{vN} = g_{ms} R_{LN} = \frac{I_3}{I_1} \frac{R_{LN}}{R_2} \qquad \text{Eq. 6}$$

The currents $I_1$ and $I_3$ track each other as they are generated from the same current source $I_0$ by mirroring. If the resistors RL3, RL4, RL5, RL6, RL7, and RL8 in FIG. 5 are of the same type as $R_2$ in FIG. 3 then, equation Eq. 2 it can be shown that the voltage gains $A_{vN}$ of the individual differential amplifier stages are independent of variations in the environmental factors of process, temperature, and power supply voltage. Physically, the master bias current $I_B$ changes with the above variations adjusting $g_{ms}$ such a manner that the amplifier voltage gain $A_{vN}$ remains constant.

Simulation using the known H-spice simulation program found that a high gain, high frequency amplifier of the prior art has a gain of 55 dB+/−10 dB. Whereas, the high gain, high frequency amplifier employing the gain compensation circuit of this invention improves the gain variation to 55 dB+/−2 dB@190 MHz over the process corners and a temperature range of −35° C. to +85° C. with compensation.

Figure 8:
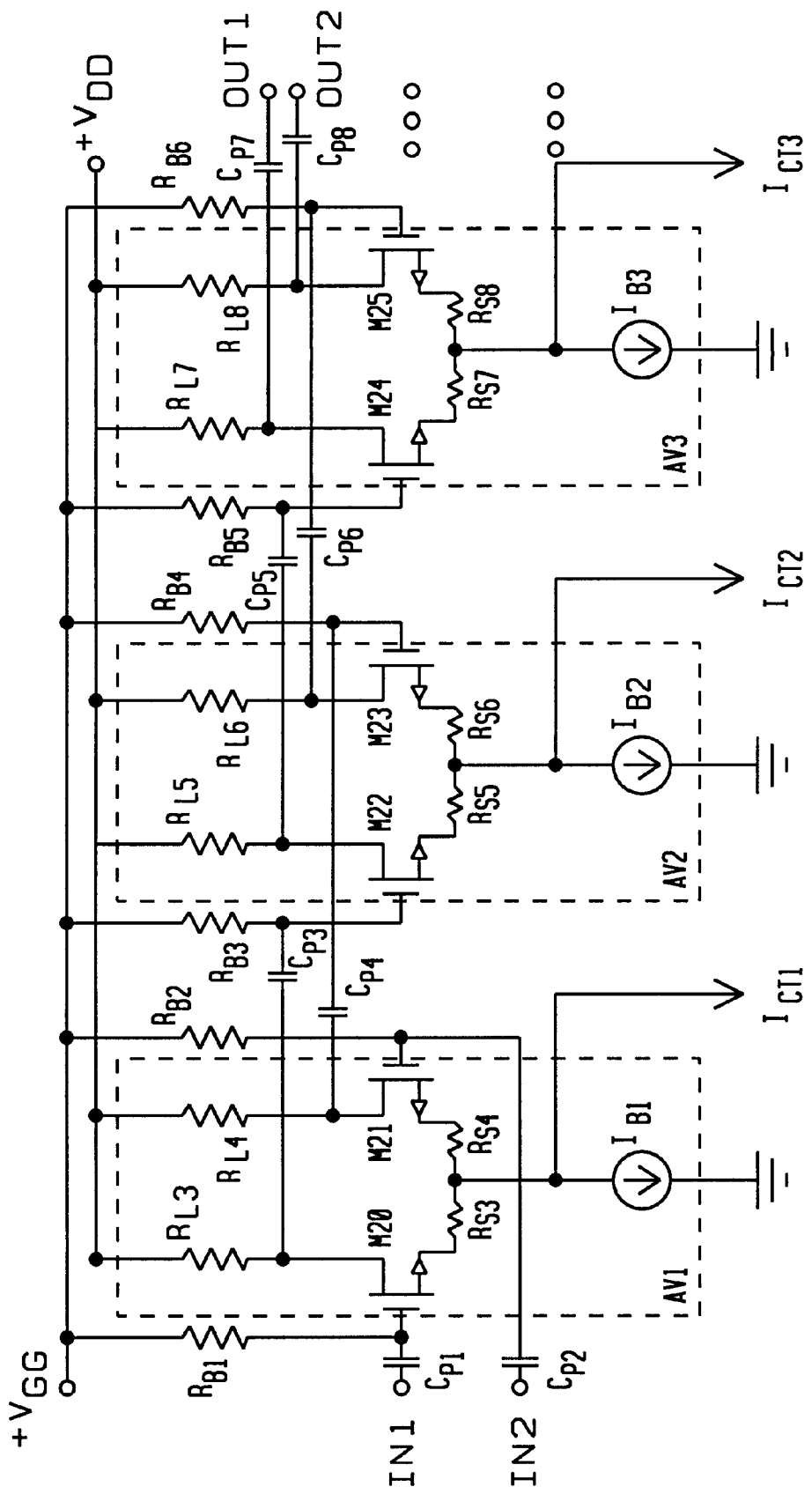
FIG. 8 is a schematic diagram of a high gain, high frequency amplifier that employs the second embodiment of a gain compensation circuit of this invention.
Figure 11:
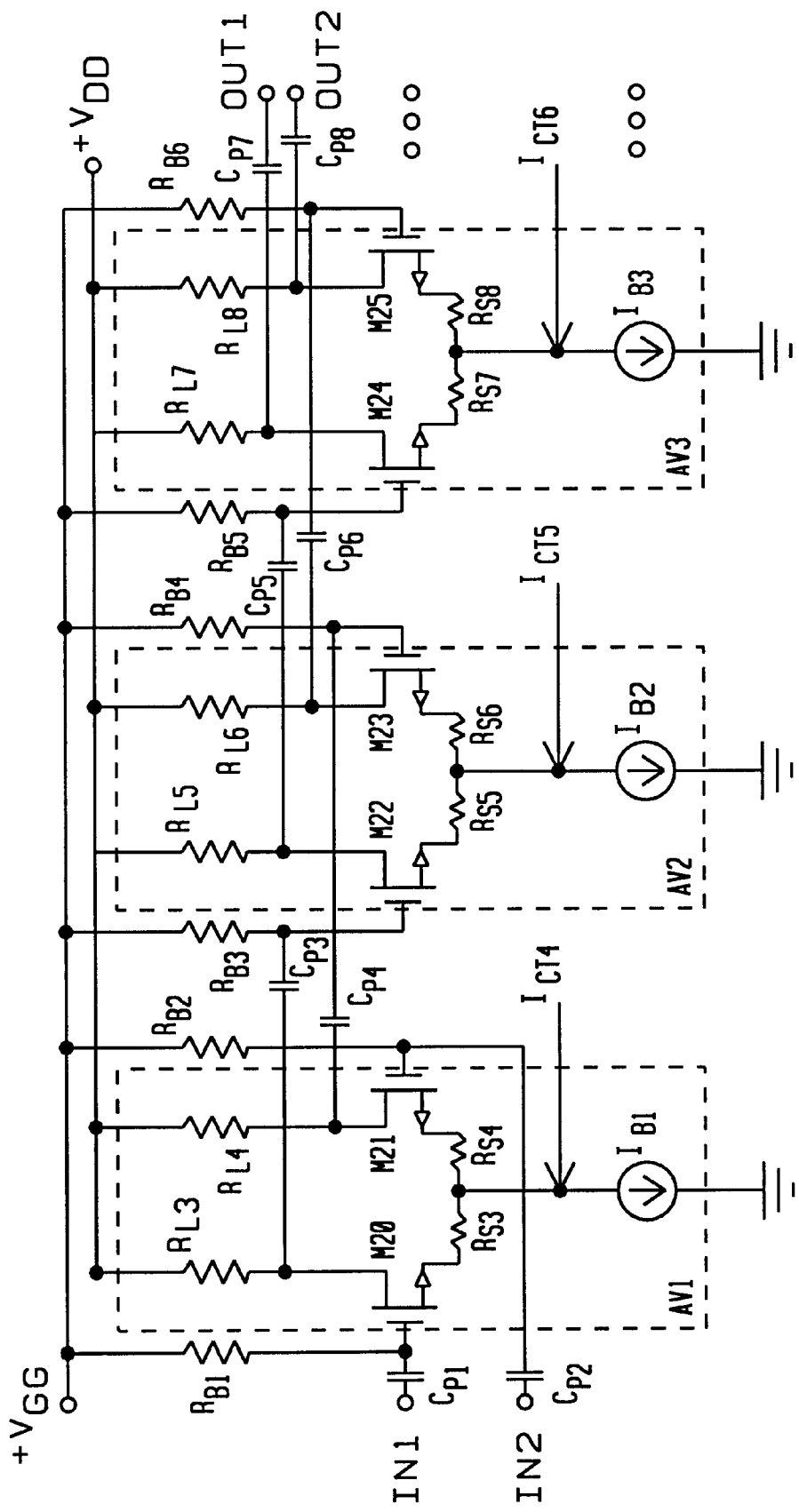
FIG. 11 is a schematic diagram of a high gain, high frequency amplifier that employs the third embodiment of a gain compensation circuit of this invention.

Referring now to FIGS. 8 and 11, the high gain, high frequency amplifier is structured and functions as shown in FIG. 2. The modulation of the biasing current for each of the differential amplifier stages $AV_1$, $AV_2$, and $AV_3$ is a result of the addition (FIG. 8) or subtraction (FIG. 11) of the compensation currents $I_{CT1}$, $I_{CT2}$, $I_{CT3}$ of FIG. 8 and the compensation currents $I_{CT4}$, $I_{CT5}$, $I_{CT6}$ of FIG. 11 from or to the biasing current sources $I_{B1}$, $I_{B2}$, and $I_{B3}$.

Figure 6:
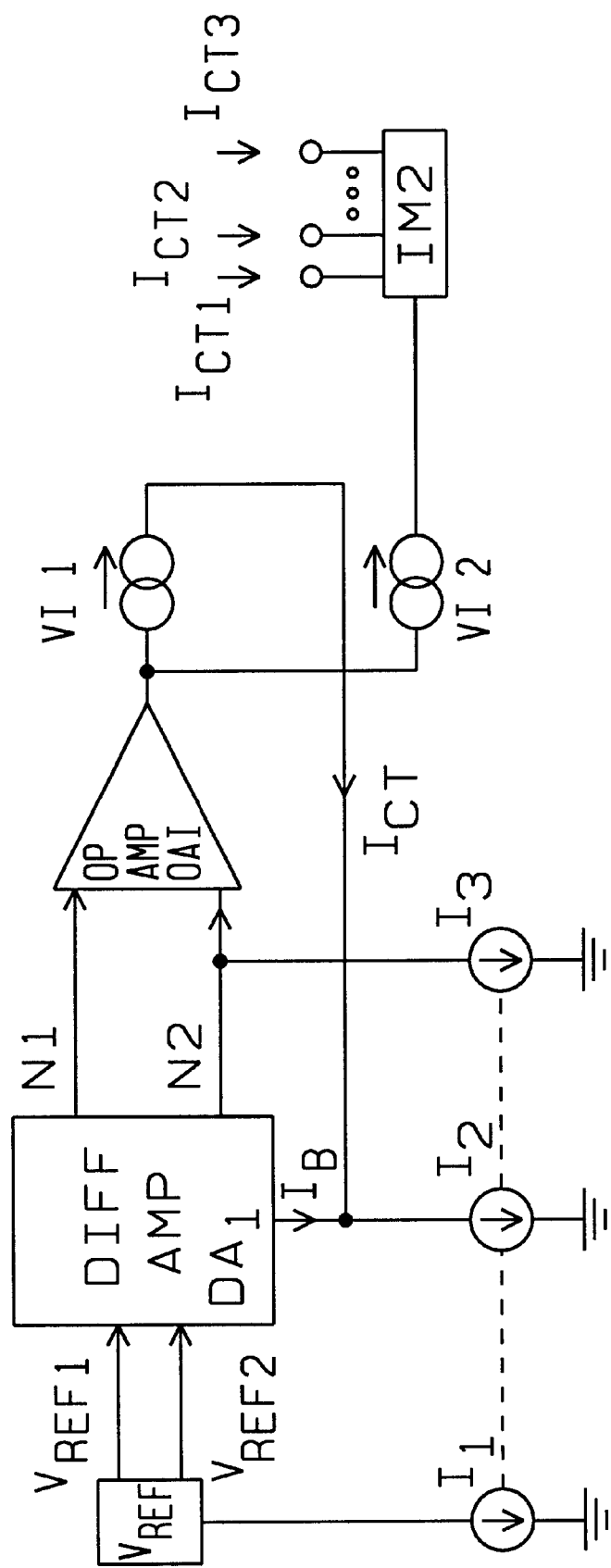
FIG. 6 is block diagram drawing of a second embodiment of a gain compensation circuit for a high gain, high frequency amplifier of this invention.

As shown in FIG. 6, the second embodiment of the gain compensation current of this invention has the voltage reference generator $V_{REF}$, the differential amplifier DA1, the operational amplifier OA1, the voltage-to-current converter VI1, and the current sources $I_1$, $I_2$, and $I_3$ form the feedback loop as described for FIG. 3. The voltage-to-current converter VI2 is now connected directly to the current mirror circuit IM2. The current mirror circuit IM2 sinks the compensation currents $I_{CT1}$, $I_{CT2}$, $I_{CT3}$. The compensation currents $I_{CT1}$, $I_{CT2}$, $I_{CT3}$ are adjusted as described above where the compensation current $I_{CT}$ varies as the environmental factors vary. In this embodiment the voltage-to-current converters VI1 and VI2 are designed to ensure the compensation current $I_{CT}$ and the compensation currents $I_{CT1}$, $I_{CT2}$, $I_{CT3}$ are equal or proportional to each other over any variation of the environmental factors.

Figure 7:
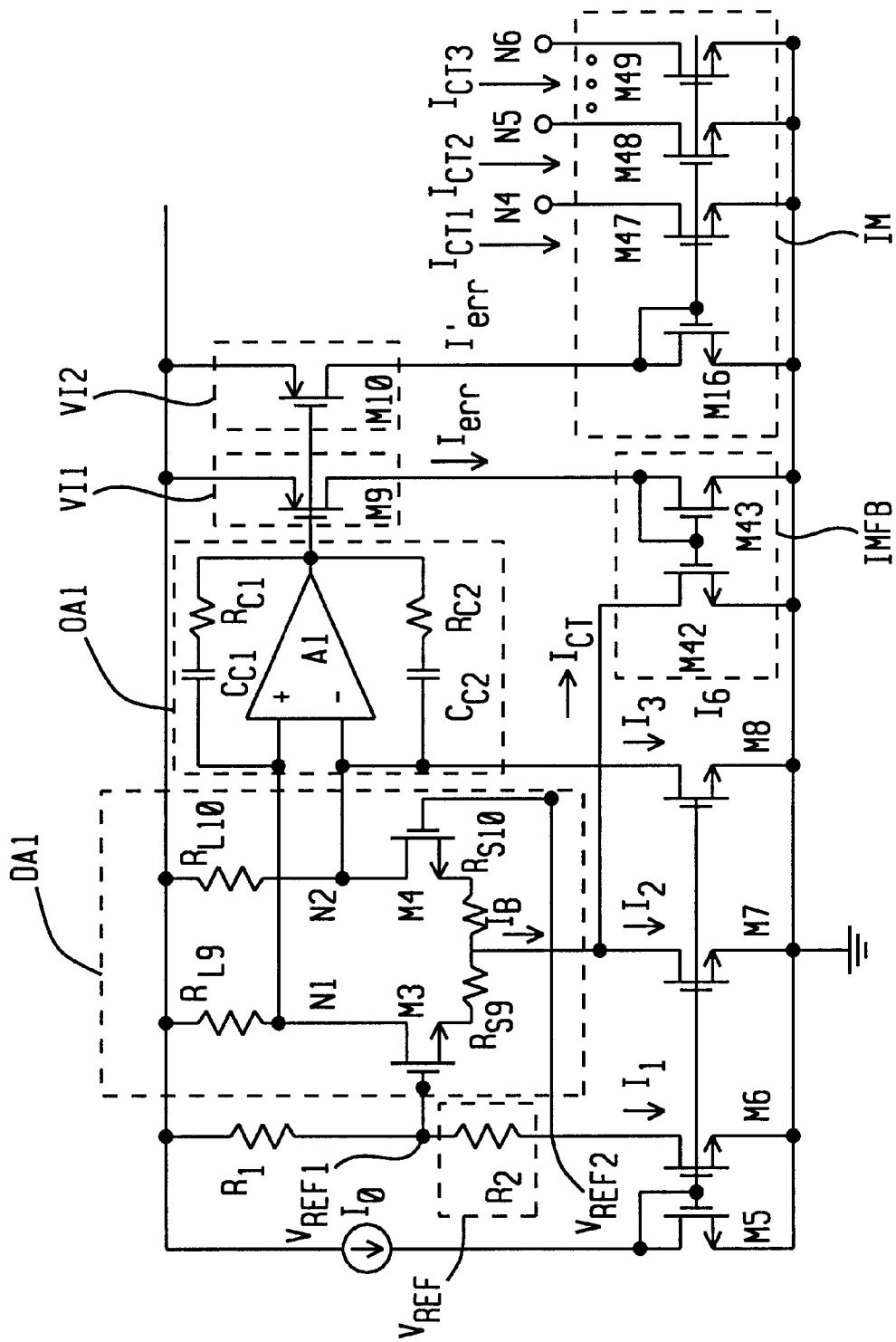
FIG. 7 is a schematic diagram of a second embodiment of a gain compensation circuit for a high gain, high frequency amplifier of this invention.

Refer now to FIG. 7 for a more detailed discussion of the second embodiment of the gain compensation circuit of this invention. The output current $I_{err}$ of the voltage-to-current converter VI1 (the drain of the PMOS transistor M9) is the input to the feedback current mirror IMFB. The output of the feedback current mirror IMFB sinks the compensation current $I_{CT}$. The NMOS transistors M42 and M43 are configured as a current mirror such that the output current $I_{err}$ of the voltage-to-current converter VI1 is the control current for the compensation current $I_{CT}$.

The output current $I'_{err}$ of the second voltage-to-current converter VI2 is the control current for the current mirrors that the sink the compensation currents $I_{CT1}$, $I_{CT2}$, $I_{CT3}$ and is substantially equal to the output current $I_{err}$. These currents are added to the bias currents $I_{B1}$, $I_{B2}$, and $I_{B3}$ of FIG. 8 respectively. These currents are adjusted as described above by stabilizing the balance between the bias current $I_B$ and the compensating current $I_{CT}$ as described above. The NMOS transistors M45, M47, M48, and M49 are configured to form the current mirror IM2 which functions as current mirror IM1 of FIG. 4 except the level of the currents are at the level of compensation current rather than the biasing currents. Even though only the compensation currents $I_{CT1}$, $I_{CT2}$, $I_{CT3}$ are provided, the gain of the differential amplifier stages AV1, AV2, and AV3 is as calculated in Eq. 6.

Figure 9:
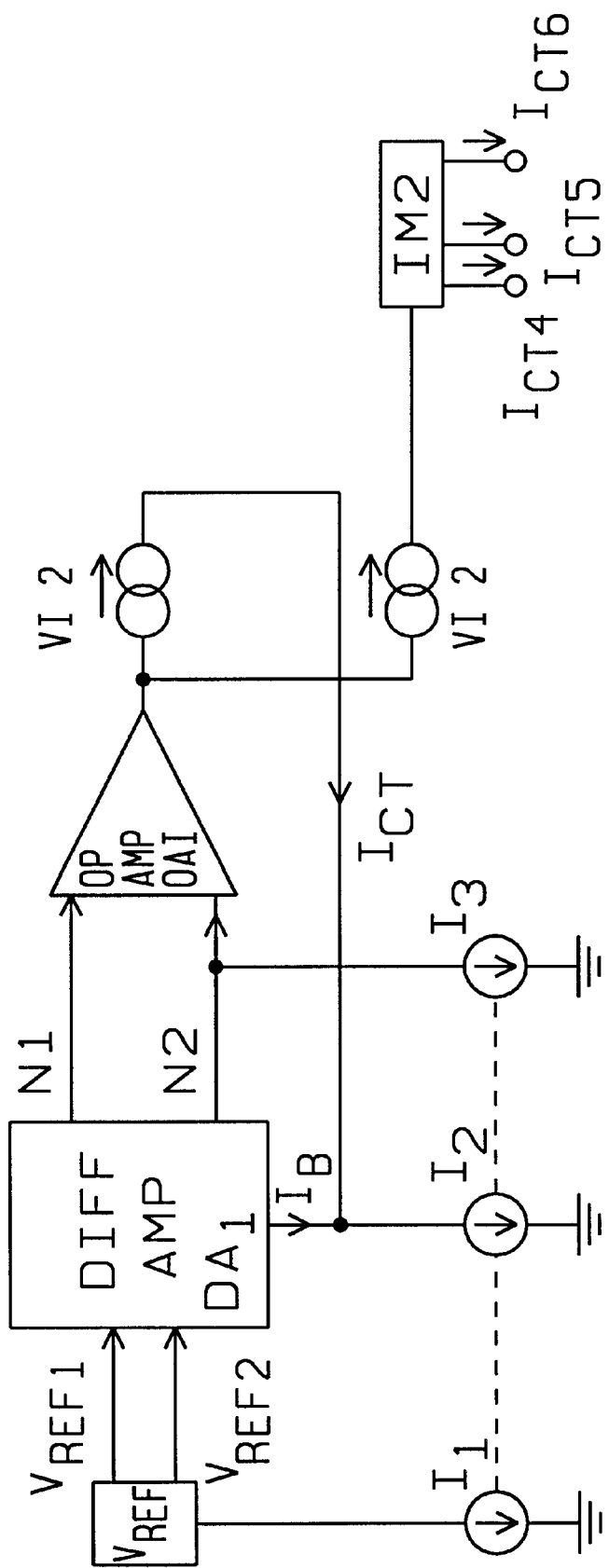
FIG. 9 is block diagram drawing of a third embodiment of a gain compensation circuit for a high gain, high frequency amplifier of this invention.

As shown in FIG. 9, the third embodiment of the gain compensation current of this invention also has the voltage reference generator $V_{REF}$, the differential amplifier DA1, the operational amplifier OA1, the voltage-to-current converter VI1, and the current sources $1_1$, $I_2$, and $I_3$ form the feedback loop as described for FIG. 3. The voltage-to-current converter VI2 is now connected to the current mirror circuit IM3. The current mirror circuit IM3 sinks the compensation currents $I_{CT4}$, $I_{CT5}$, $I_{CT6}$. These currents are subtracted to the bias currents $I_{B1}$, $I_{B2}$, and $I_{B3}$ of FIG. 11 respectively. The compensation currents $I_{CT4}$, $I_{CT5}$, $I_{CT6}$ are adjusted as described above where the compensation current $I_{CT}$ varies as the environmental factors vary. In this embodiment the voltage-to-current converters VI1 and VI2 are designed to ensure the compensation current $I_{CT}$ and the compensation currents $I_{CT4}$, $I_{CT5}$, $I_{CT6}$ are equal or proportional to each other over any variation of the environmental factors.

Figure 10:
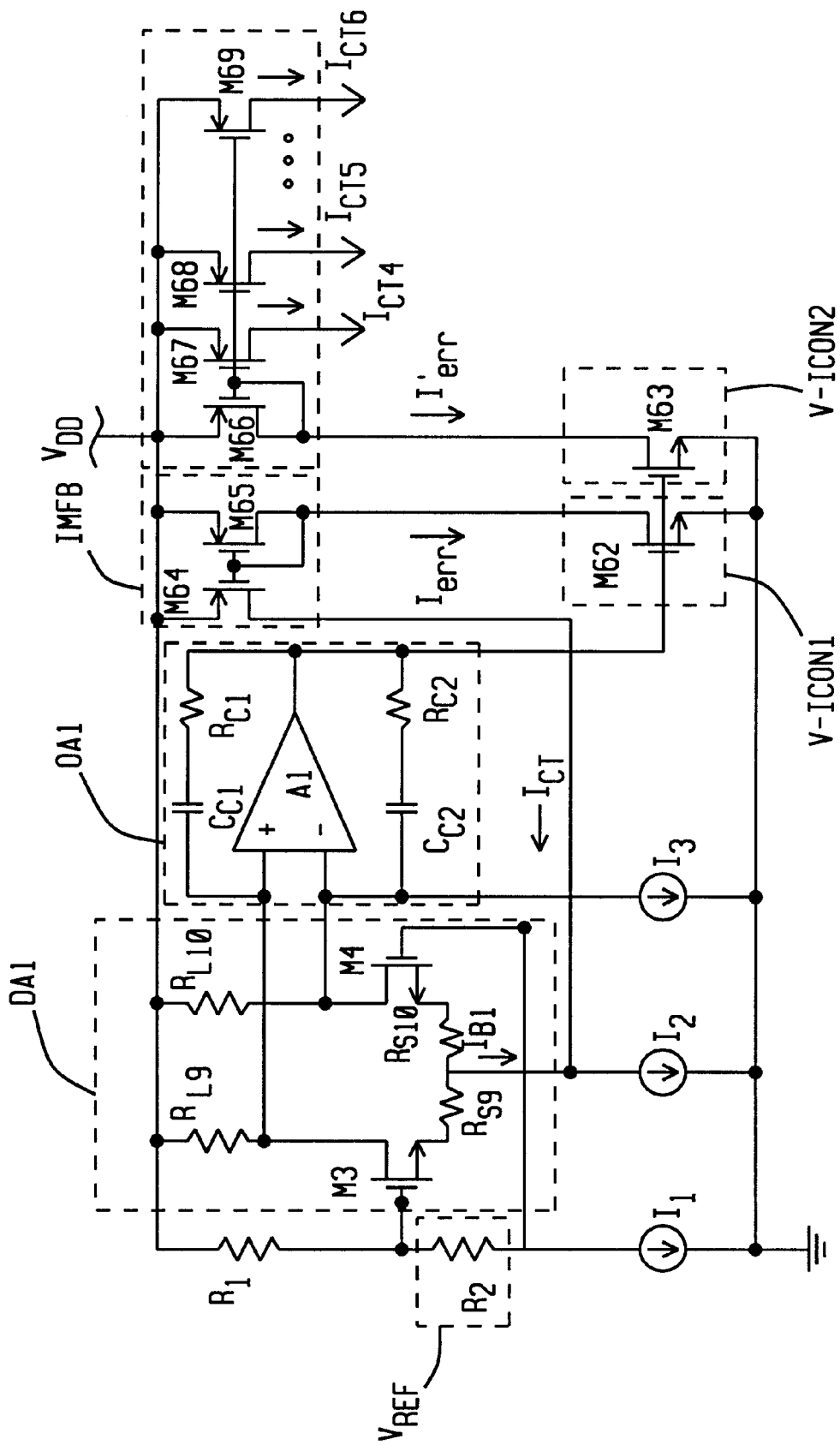
FIG. 10 is a schematic diagram of a third embodiment of a gain compensation circuit for a high gain, high frequency amplifier of this invention.

Refer now to FIG. 10 for a more detailed discussion of the third embodiment of the gain compensation circuit of this invention. The output current $I_{err}$ of the voltage-to-current converter VI1 (the drain of the NMOS transistor M62) is the input to the feedback current mirror IMFB. The output of the feedback current mirror IMFB sinks the compensation current $I_{CT}$. The NMOS transistors M64 and M65 are configured as a current mirror such that the output current $I_{err}$ of the voltage-to-current converter VI1 is the control current for the compensation current $I_{CT}$.

The output current $I'_{err}$ of the second voltage-to-current converter VI2 is the control current for the current mirrors that source the compensation currents $I_{CT4}$, $I_{CT5}$, $I_{CT6}$ and is substantially equal to the output current $I_{err}$. These currents are adjusted as described above by stabilizing the balance between the bias current $I_B$ and the compensating current $I_{CT}$ as described above. The PMOS transistors M66, M67, M68, and M69 are configured to form the current mirror IM2 to provide the level of the currents at the level of compensation current rather than the biasing currents. Even though only the compensation currents $I_{CT4}$, $I_{CT5}$, $I_{CT6}$ are provided, the gain of the differential amplifier stages AV1, AV2, and AV3 is also as calculated in Eq. 6.

As is evident from the second and third embodiment, other configurations of the gain compensation circuit of this invention are possible by substituting PMOS transistors for NMOS transistors and NMOS transistors for PMOS transistors. While this invention has been particularly shown and described with reference to the preferred embodiments thereof, it will be understood by those skilled in the art that various changes in form and details may be made without departing from the spirit and scope of the invention.

What is claimed is:

1. A gain compensation circuit to adjust a gain factor of an amplifier, said amplifier having a plurality of series connected differential amplifier stages, said gain compensation circuit comprising:

a current adjustment circuit that provides a master biasing signal that modulates a biasing current provided to each differential amplifier stage of the plurality of differential amplifier stages for adjusting the gain factor of the amplifier; and a gain factor evaluation circuit in communication with the current adjustment circuit to determine changes in the gain factor and to provide a compensation signal to the current adjustment circuit indicating a modulation factor that changes said master biasing signal for modulating said biasing current for each differential amplifier stage.

2. The circuit of claim 1 wherein the current adjustment circuit comprises:

a first reference constant current source mirrored from a reference current source to generate a reference current;

a first replica amplifier connected to the first reference constant current source to conduct the master biasing signal that is modified according to the compensation signal; and a plurality of mirroring current sources to provide the biasing currents for each differential amplifier stage and in communication with the first replica amplifier stage such that each mirroring current source generate one biasing current proportional to the master biasing signal.

3. The circuit of claim 1 wherein the current adjustment circuit comprises:

a plurality of mirroring current sources to provide the biasing currents for each differential amplifier stage and in communication with the gain factor evaluation circuit to receive the compensation signal, said compensation signal being a compensation current from which said biasing currents are mirrored.

4. The circuit of claim 1 wherein the gain factor evaluation circuit comprises:

a reference voltage source to provide a first and a second reference voltage;

a second replica amplifier stage having a first input connected to the reference voltage source to receive the first reference voltage and a second input connected to the reference voltage source to receive the second reference voltage, said second replica amplifier stage amplifying a voltage difference between the first and the second reference voltages; and a compensation signal generator connected to the second replica amplifier stage to receive the amplified voltage difference, modulate a biasing current of the second replica amplifier stage and, when the amplified voltage difference approaches a null level, producing the compensation signal.

5. The circuit of claim 4 wherein the compensation signal generator comprises:

an operational amplifier having an in-phase input and an out-of-phase input connected to receive the amplified voltage difference;

a first master current source to provide the biasing current to the second replica amplifier;

a second master current source joined to the out-of-phase input of the operational amplifier to cause a voltage level to be present at said out-of-phase input and in communication with the first master current source such that the first and second master current sources are modified by environmental changes;

a current feedback connected between an output of the operational amplifier and the first master current source to sink a compensation current to said first master current source wherein the biasing current of the second replica amplifier and the compensating current are combined such as the operational amplifier changes the compensation current, the biasing current of the second replica amplifier being adjusted inversely; and a compensation signal converter communicating with the operational amplifier to form the compensation signal as a function of the compensating current.

6. The circuit of claim 5 wherein the compensation signal converter is a first voltage-to-current converter.

7. The circuit of claim 5 wherein the current feedback comprises a second voltage-to-current converter to convert a compensating voltage at the output of the operational amplifier to the compensation current.

8. A high gain, high frequency amplifier comprising:

a plurality of differential amplifier stages connected serially; and a gain compensation circuit connected to each of the differential amplifier stages to adjust a gain factor of each differential amplifier stage, said gain compensation circuit comprising:

a current adjustment circuit that provides a master biasing signal that modulates a biasing current provided to each differential amplifier stage of the plurality of differential amplifier stages, said modulation of the biasing current adjusting the gain factor of each of the differential amplifier stages, and a gain factor evaluation circuit in communication with the current adjustment circuit to determine changes in the gain factor and to provide a compensation signal to the current adjustment circuit indicating a modulation factor that changes said master biasing signal for modulating said biasing current for each differential amplifier stage.

9. The amplifier of claim 8 wherein the current adjustment circuit comprises:

a first reference constant current source mirrored from a reference current source to generate a reference current;

a first replica amplifier connected to the first reference constant current source to conduct the master biasing signal that is modified according to the compensation signal; and a plurality of mirroring current sources to provide the biasing currents for each differential amplifier stage and in communication with the first replica amplifier stage such that each mirroring current source generates one biasing current proportional to the master biasing signal.

10. The amplifier of claim 8 wherein the current adjustment circuit comprises:

a plurality of mirroring current sources to provide the biasing currents for each differential amplifier stage and in communication with the gain factor evaluation circuit to receive the compensation signal, said compensation signal being a compensation current from which said biasing currents are mirrored.

11. The amplifier of claim 8 wherein the gain factor evaluation circuit comprises:

a reference voltage source to provide a first and a second reference voltage;

a second replica amplifier stage having a first input connected to the reference voltage source to receive the first reference voltage and a second input connected to the reference voltage source to receive the second reference voltage, said second replica amplifier stage amplifying a voltage difference between the first and the second reference voltages; and a compensation signal generator connected to the second replica amplifier stage to receive the amplified voltage difference, modulate a biasing current of the second replica amplifier stage and, when the amplified voltage difference approaches a null level, producing the compensation signal.

12. The amplifier of claim 11 wherein the compensation signal generator comprises:

an operational amplifier having an in-phase input and an out-of-phase input connected to receive the amplified voltage difference;

a first master current source to provide the biasing current to the second replica amplifier;

a second master current source joined to the out-of-phase input of the operational amplifier to cause a voltage level to be present at said out-of-phase input and in communication with the first master current source such that the first and second master current sources are modified by environmental changes;

a current feedback connected between an output of the operational amplifier and the first master current source to sink a compensation current to said first master current source wherein the biasing current of the second replica amplifier and the compensating current are combined such as the operational amplifier changes the compensation current, the biasing current of the second replica amplifier being adjusted inversely; and a compensation signal converter communicating with the operational amplifier to form the compensation signal as a function of the compensating current.

13. The amplifier of claim 12 wherein the compensation signal converter is a first voltage-to-current converter.

14. The amplifier of claim 12 wherein the current feedback comprises a second voltage-to-current converter to convert a compensating voltage at the output of the operational amplifier to the compensation current.

15. A gain compensation circuit to adjust a gain factor of an amplifier, said amplifier having a plurality of series connected differential amplifier stages, said gain compensation circuit comprising:

a current adjustment circuit that provides a master biasing signal that modulates a biasing current provided to each differential amplifier stage of the plurality of differential amplifier stages for adjusting the gain factor of the amplifier, said current adjustment circuit comprising:

a first reference constant current source mirrored from a reference current source to generate a reference current, a first replica amplifier connected to the first reference constant current source to conduct the master biasing signal that is modified according to a compensation signal, and a plurality of mirroring current sources to provide the biasing currents for each differential amplifier stage and in communication with the first replica amplifier stage such that each mirroring current source generates one biasing current proportional to the master biasing signal; and a gain factor evaluation circuit in communication with the current adjustment circuit to determine changes in the gain factor and to provide the compensation signal to the current adjustment circuit indicating a modulation factor for said biasing current for each differential amplifier stage, said gain factor evaluation circuit comprising:

a reference voltage source to provide a first and a second reference voltage;

a second replica amplifier stage having a first input connected to the reference voltage source to receive the first reference voltage and a second input connected to the reference voltage source to receive the second reference voltage, said second replica amplifier stage amplifying a voltage difference between the first and the second reference voltages; and a compensation signal generator connected to the second replica amplifier stage to receive the amplified voltage difference, modulate a biasing current of the second replica amplifier stage and, when the amplified voltage difference approaches a null level, producing the compensation signal.

16. The circuit of claim 15 wherein the compensation signal generator comprises:

an operational amplifier having an in-phase input and an out-of-phase input connected to receive the amplified voltage difference;

a first master current source to provide the biasing current to the second replica amplifier;

a second master current source joined to the out-of-phase input of the operational amplifier to cause a voltage level to be present at said out-of-phase input and in communication with the first master current source such that the first and second master current sources are modified by environmental changes;

a current feedback connected between an output of the operational amplifier and the first master current source to sink a compensation current to said first master current source wherein the biasing current of the second replica amplifier and the compensating current are combined such as the operational amplifier changes the compensation current, the biasing current of the second replica amplifier being adjusted inversely; and a compensation signal converter communicating with the operational amplifier to form the compensation signal as a function of the compensating current.

17. The circuit of claim 16 wherein the compensation signal converter is a first voltage-to-current converter.

18. The circuit of claim 16 wherein the current feedback comprises a second voltage-to-current converter to convert a compensating voltage at the output of the operational amplifier to the compensation current.

19. A gain compensation circuit to adjust a gain factor of an amplifier, said amplifier having a plurality of series connected differential amplifier stages, said gain compensation circuit comprising:

a current adjustment circuit that provides a master biasing signal that modulates a biasing current provided to each differential amplifier stage of the plurality of differential amplifier stages for adjusting the gain factor of the amplifier; said current adjustment circuit comprising:

a plurality of mirroring current sources to provide the biasing current for each differential amplifier stage and in communication with a gain factor evaluation circuit to receive the compensation signal, said compensation signal being a compensation current from which said biasing currents are mirrored; and the gain factor evaluation circuit in communication with the current adjustment circuit to determine changes in the gain factor and to provide a compensation signal to the current adjustment circuit indicating a modulation factor that changes said master biasing signal for modulating said biasing current for each differential amplifier stage, said gain factor evaluation circuit comprising:

a reference voltage source to provide a first and a second reference voltage;

a second replica amplifier stage having a first input connected to the reference voltage source to receive the first reference voltage and a second input connected to the reference voltage source to receive the second reference voltage, said second replica amplifier stage amplifying a voltage difference between the first and the second reference voltages; and a compensation signal generator connected to the second replica amplifier stage to receive the amplified voltage difference, modulate a biasing current of the second replica amplifier stage and, when the amplified voltage difference approaches a null level, producing the compensation signal.

20. The circuit of claim 19 wherein the compensation signal generator comprises:

an operational amplifier having an in-phase input and an out-of-phase input connected to receive the amplified voltage difference;

a first master current source to provide the biasing current to the second replica amplifier;

a second master current source joined to the out-of-phase input of the operational amplifier to cause a voltage level to be present at said out-of-phase input and in communication with the first master current source such that the first and second master current sources are modified by environmental changes;

a current feedback connected between an output of the operational amplifier and the first master current source to sink the compensation current to said first master current source wherein the biasing current of the second replica amplifier and the compensating current are combined such as the operational amplifier changes the compensation current, the biasing current of the second replica amplifier being adjusted inversely; and a compensation signal converter communicating with the operational amplifier to form the compensation signal as a function of the compensating current.

21. The circuit of claim 19 wherein the compensation signal converter is a first voltage-to-current converter.

22. The circuit of claim 19 wherein the current feedback comprises a second voltage-to-current converter to convert a compensating voltage at the output of the operational amplifier to the compensation current.

* * * * *